June 10, 1969 R. L. KNAUBER ET AL 3,449,687
DIFFERENTIAL AMPLIFIER
Filed May 20, 1965
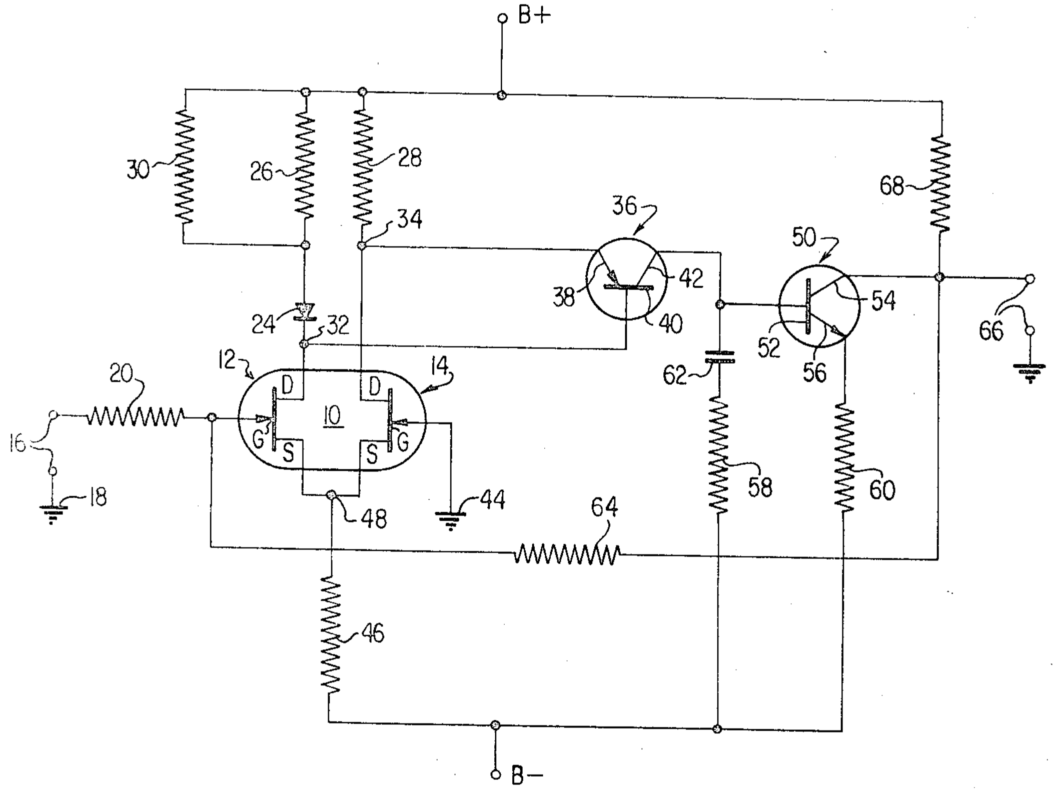
INVENTORS.
RONALD L. KNAUBER
EDDIE A. EVEL
BY Sughrue, Rothwell, Mion, Zinn & Macpeak
ATTORNEYS.

United States Patent Office 3,449,687

Patented June 10, 1969

3,449,687

DIFFERENTIAL AMPLIFIER

Ronald L. Knauber, Colorado Springs, and Eddie A. Evel, Englewood, Colo., assignors to Martin-Marietta Corporation, New York, N.Y., a corporation of Maryland Filed May 20, 1965, Ser. No. 457,282
Int. Cl. H03f 3/68, 3/04, 3/14
U.S. Cl. 330—30 5 Claims

ABSTRACT OF THE DISCLOSURE

A simplified differential amplifier circuit using a pair of matched field effect transistors as a differential input stage, followed by a single transistor as an intermediate stage between the differential stage and a non-differential output stage.

This invention relates in general to a differential amplifier, and more particularly to a novel and greatly simplified differential amplifier circuit having only a single stage of differential amplification.

Differential amplifiers are widely used in the analog signal handling arts as the internal portion of operational amplifiers because they exhibit good temperature stability and relatively high overall gain characteristics. When an input impedance is connected to the input stage of such an amplifier and a feedback impedance is connected between the amplifier output and input, the overall gain is independent of the differential amplifier gain but instead is determined by the ratio of feedback to input impedances.

In prior art differential amplifiers, the input stage commonly comprises a pair of differentially connected transistors or vacuum tubes, and the output stage is usually a transistor or vacuum tube for providing non-differential amplification. Such amplifiers also commonly employ additional, intermediate stages of differential amplification following the input stage and preceding the non-differential output stage, and in virtually all cases, at least a second differential stage is used in order to couple the differential output of the input stage to the input of the first non-differential stage of amplification. This is normally done by grounding the output of one of the tubes or transistors of the second differential stage and connecting the ungrounded output of that stage to the input of the first non-differential stage of amplification.

The present invention eliminates the need for such additional stages of differential amplification by employing a single transistor as an intermediate stage between the differential input stage and the non-differential output stage. A further unique feature of the invention resides in the use of a pair of matched field effect transistors for the differential input stage. These features result in numerous improvements and advantages over the prior art differential amplifiers, as more fully developed below. For example, in amplifiers using at least one intermediate differential stage, a minimum of two transistors or tubes plus their associated biasing resistors are necessary. The biasing resistors are continuously supplied with operating current by the power supplies which results in a definite power loss. By eliminating the second differential stage and using a single transistor, as will be explained hereafter, the number of parts or electrical components which make up the overall differential amplifier circuit is reduced to approximately one-third, thereby increasing the reliability of the amplifier, while at the same time decreasing the power consumption.

In all differential amplifiers having a feedback connection, there is a slight D-C output when there is no input applied to the amplifier. This slight output is referred to in the art as the D-C offset voltage and is generally undesirable in that it constitutes a source of error. In the present invention, the use of matched field effect transistors in the differential input stage substantially reduces or eliminates the undesirable D-C offset. If conventional transistors are employed in the differential input stage, the input impedances and the feedback impedance are connected to the bases of the transistors. The bases draw certain quantities of current which must flow through the input and feedback resistors and consequently this adds to the D-C offset voltage. Field effect transistors, on the other hand, are known to possess exceptionally high input impedances, and their use in this manner as the input differential stage therefore results in substantially zero current being drawn into their gate terminals through the input and feedback resistances. Furthermore, since the gate terminals draw substantially zero current it is not necessary, as in the case of conventional transistors, to provide identical or closely matched input impedances on the gates of both field effect transistors to minimize D-C offset voltage. Instead, one of the gates may be connected directly to ground. This latter feature allows a variation in the overall gain by merely inserting a different external input impedance without having to insert an identical impedance in the gate circuit of the second differentially connected field effect transistor.

It is a primary object of this invention to provide a new and improved differential amplifier characterized by a relatively low number of parts and having a substantially reduced internal power consumption and high reliability.

It is a further object of this invention to provide such an amplifier having a relatively high input impedance and high overall gain achieved through the use of field effect transistors as the first and only stage of differential amplification.

Another object of the invention is to provide a novel operational amplifier circuit having a high reliability, a minimum number of parts, and a low power consumption.

The foregoing and other objects, features and advantages of the invention will be apparent to those skilled in the art from the following more detailed description of a preferred embodiment of the invention, as illustrated in the accompanying drawing, in which the single figure shows a schematic circuit diagram of a differential amplifier constructed in accordance with the teachings of the invention.

It should be noted that the terms differential amplifier and operational amplifier are used somewhat interchangeably in the specification. Actually, the term differential amplifier applies to the amplifier shown in the drawing in the absence of a feedback impedance 64, whereas the term operational amplifier applies when there is a feedback connection. The gain of the differential amplifier is extremely high, approximately 4000, and is determined by the internal parameters of the circuit shown in the figure, whereas the gain of the operational amplifier is determined by the ratio of the feedback impedance 64 to the input impedance 20, if the differential amplifier has a high gain and a high input impedance.

Referring to the drawing, there is shown an operational amplifier having a differential input stage, a non-differential output stage, an intermediate stage, and a resistive feedback network. The input stage 10 comprises a pair of matched field effect transistors 12 and 14. As is well known in the art, each field effect transistor has gate, drain, and source electrodes labeled G, D, and S, respectively. Field effect transistors are commonly known to act as voltage controlled impedances whereby the gate-source voltage controls the drain-source impedance. The input impedance of a field effect transistor is very high, thus allowing in the present invention a very high input impedance to the differential stage of amplification.

The input signal is applied across terminals 16, one of which is connected to ground at point 18 and the other of which is connected to the gate electrode of field effect transistor 12 via an input resistance 20. It is well known that in many differential amplifier circuits it is desirable to connect both inputs respectively to the control electrodes of the differentially connected acitve elements. In the drawing, the latter-mentioned type of connection could be implemented by connecting the lower input terminal 16 through a resistance directly to the gate electrode of field effect transistor 14. In such circumstances, the input signal would be floating rather than grounded, but the circuit would operate in a manner substantially identical to that explained below.

A D-C power supply source indicated as B+ at the top of the drawing and B− at the bottom provides the bias currents and voltages to the stages of the operational amplifier. The B+ source is connected to the drain electrode of field effect transistor 12 via resistor 26 and silicon diode 24, the purpose of the latter being to provide additional temperature stability. Resistor 30, known in the art as a trim resistor, may be inserted into the circuit in parallel with resistor 26 to remove any initial D-C offset voltage which may be caused by slight, unavoidable differences in the characteristics of the substantially identical field effect transistors 12 and 14. The ohmic value of resistor 30 depends in each case on the parameters of the circuit but is always chosen to adjust the drain resistance of field effect transistor 12 in order to have a zero voltage reading across output terminal 66 when there is no input voltage. The B+ source is also connected to the drain electrode of field effect transistor 14 through a resistor 28. The source electrodes of field effect transistors 12 and 14 are connected together at point 48 and to the B− source via resistor 46.

The output from the input differential stage appears across points 32 and 34. An intermediate stage for connecting the output of the differential stage to the input of a non-differential stage of amplification comprises a PNP transistor 36 having an emitter electrode 38 connected to point 34 and a base electrode 40 connected to point 32. The output from the intermediate stage is taken from the collector electrode 42 of transistor 36.

The output from the intermediate stage is applied directly to the base 52 of transistor 50 which comprises the output non-differential stage of amplification. Transistor 50 is shown as an NPN transistor and includes collector electrode 54 and emitter electrode 56. Collector 54 is connected to the B+ source through resistor 68, and emitter electrode 56 is connected to the B− source through resistor 60. Capacitor 62 and resistor 58, connected in series between the base 52 of transistor 50 and the B− source, along with resistor 60, are added to the circuit to provide stability.

The output from the operational amplifier appears across terminals 66, one of which is connected to ground and the other of which is connected to collector 54 of transistor 50. A feedback resistor 64 may be connected between the output and the input of the overall amplifier in a manner well known in the art.

In operation, assume an increase in the input signal applied across terminals 16 is to be amplified and made available across output terminals 66 in its amplified form. An increase in the signal at input terminals 16 causes an increase in the forward direction of the gate-source voltage of field effect transistor 12. The latter increase causes a lowering of the drain-source impedance of this transistor and a corresponding increase in the current flow through the drain-source path and through resistor 26. Point 48 therefore rises in potential, thus lowering the forward drain-source voltage of field effect transistor 14 and consequently increasing the drain-source impedance thereof and lowering the current flowing through resistor 28 and the drain-source path of field effect transistor 14.

The change in the proportion of current flowing through resistor 26 and field effect transistor 12, as opposed to that flowing through resistor 28 and field effect transistor 14, causes a decrease in voltage at point 32 and an increase in voltage at point 34. This increase and decrease of the voltages at these points forward biases transistor 36 of the intermediate stage causing an upswing in the current appearing at collector 42. The current rise on collector 42 is amplified by transistor 50 in a conventional manner and the amplified output appears across output terminals 66. This output signal acts through resistor 64 in such a way as to oppose the effect of the input signal at the gate of field effect transistor 12. With a high gain D-C amplifier, the change at the gate of field effect transistor 12 is very small and the voltage gain from terminal 16 to terminal 66 is very nearly the ratio of the feedback impedance to the input impedance.

It can be seen from the foregoing description that the invention is an improvement and has definite advantages over prior art differential amplifiers. Due to the minimum number of parts used there is an increase in reliability and a decrease in power loss. Also the use of field effect transistors reduces the errors caused by D-C offset and allows additional input resistances to be switched into the circuit without the need for changing any internal impedances.

While the invention has been particularly shown and described with reference to a preferred embodiment thereof, it will be understood by those skilled in the art that various changes in form and details may be made therein without departing from the spirit and scope of the invention.

What is claimed is:

1. A differential amplifier comprising:

(a) an input stage including a matched pair of field effect transistors, each having a source electrode, a drain electrode and a gate electrode, (b) means connecting the source electrodes to a source of negative operating potential, (c) means connecting the drain electrodes to a source of positive operating potential, (d) means connecting an input signal to one of the gate electrodes, (e) means connecting the other gate electrode to ground, (f) an intermediate stage including a PNP transistor having an emitter electrode, a base electrode and a collector electrode, (g) means individually connecting the drain electrodes of the input stage transistors to the emitter and base electrodes of the intermediate stage transistor, (h) an output stage including an NPN transistor having an emitter electrode, a base electrode and a collector electrode, (i) means connecting the collector electrode of the intermediate stage transistor to the base electrode of the output stage transistor, and (j) means connected to the collector electrode of the output stage transistor for deriving an output signal therefrom.

2. An operational amplifier comprising:

(a) a differential input stage including a pair of field effect transistors, each having a source electrode, a drain electrode and a gate electrode, (b) means connecting appropriate sources of operating potentials to the source and drain electrodes of the input stage transistors, (c) means connecting an input signal to one of the gate electrodes, (d) means connecting the other gate electrode to ground, (e) an intermediate stage transistor having an emitter electrode, a base electrode and a collector electrode.

(f) means individually connecting the drain electrodes of the input stage transistors to the emitter and base electrodes of the intermediate stage transistors, (g) an output stage transistor having an emitter electrode, a base electrode and a collector electrode, (h) means connecting the collector electrode of the intermediate stage transistor to the base electrode of the output stage transistor, (i) means connected to the collector electrode of the output stage transistor for deriving an output signal therefrom, and (j) resistive means connected between the collector electrode of the output stage transistor and the one of the gate electrodes to provide a feedback path.

3. A differential amplifier comprising:

(a) an input stage including a matched pair of field effect transistors, each having a source electrode, a drain electrode and a gate electrode, (b) means connecting the source electrodes to a source of negative operating potential, (c) means connecting the drain electrodes to a source of positive operating potential, (d) means connecting an input signal to one of the gate electrodes, (e) means connecting the other gate electrode to ground, (f) an intermediate stage including a transistor having an emitter electrode, a base electrode and a collector electrode, (g) means individually connecting the drain electrodes of the input stage transistors to the emitter and base electrodes of the intermediate stage transistor, (h) an output stage including a transistor having an emitter electrode, a base electrode and a collector electrode, (i) means connecting the collector electrode of the intermediate stage transistor to the base electrode of the output stage transistor, and (j) means connected to the collector electrode of the output stage transistor for deriving an output signal therefrom.

4. A differential amplifier comprising:

(a) an input stage including a matched pair of field effect transistors, each having a source electrode, a drain electrode and a gate electrode, (b) means connecting the source electrodes to a source of negative operating potential, (c) means connecting the drain electrodes to a source of positive operating potential, (d) means connecting an input signal to one of the gate electrodes, (e) means connecting the other gate electrode to ground, (f) an intermediate stage including a transistor having an input circuit and an output circuit, (g) means individually connecting the drain electrodes of the input stage transistors to the input circuit of the intermediate stage transistor, (h) an output stage including a transistor having an input circuit and an output circuit, and (i) means connecting the output circuit of the intermediate stage transistor to the input circuit of the output stage transistor.

5. A differential amplifier comprising:

(a) an input stage including a matched pair of field effect transistors, each having a source electrode, a drain electrode and a gate electrode, (b) means connecting the source electrodes to a source of negative operating potential, (c) means connecting the drain electrodes to a source of positive operating potential, (d) means connecting an input signal to one of the gate electrodes, (e) means connecting the other gate electrode to ground, (f) a single-ended stage including a transistor having an input circuit and an output circuit, (g) means individually connecting the drain electrodes of the input stage transistors to the input circuit of the single-ended stage transistor.

References Cited

UNITED STATES PATENTS

| | | | |
|---|---|---|---|
| 3,277,385 | 10/1966 | Matsumoto | 330—30 X |
| 3,317,850 | 5/1967 | Hilbiber | 307—304 X |

OTHER REFERENCES

R. Brugger: Electronic Design, vol. 12, No. 11, May 25, 1964.

ROY LAKE, *Primary Examiner.*

LAWRENCE J. DAHL, *Assistant Examiner.*

U.S. Cl. X.R.

330—24, 38